US006867966B2

(12) United States Patent
Smith et al.

(10) Patent No.: US 6,867,966 B2
(45) Date of Patent: Mar. 15, 2005

(54) METHOD AND APPARATUS FOR RACK MOUNTING COMPUTER COMPONENTS

(75) Inventors: John V. Smith, Poway, CA (US);
Victor P. Hester, El Cajon, CA (US);
William A. Wylie, San Diego, CA (US)

(73) Assignee: Verari Systems, Inc., San Diego, CA (US)

( * ) Notice: Subject to any disclaimer, the term of this patent is extended or adjusted under 35 U.S.C. 154(b) by 62 days.

(21) Appl. No.: 10/160,526

(22) Filed: May 31, 2002

(65) Prior Publication Data

US 2003/0223193 A1 Dec. 4, 2003

(51) Int. Cl.[7] .............................................. G06F 1/20
(52) U.S. Cl. ...................... 361/687; 361/818; 361/695; 211/175
(58) Field of Search ................................ 361/687, 690, 361/694, 695, 715, 716, 724–727; 211/175; 165/185, 80.4, 104.33; 174/15.2

(56) References Cited

U.S. PATENT DOCUMENTS

| | | | | |
|---|---|---|---|---|
| 3,858,093 A | * | 12/1974 | Mila | 361/818 |
| 3,868,158 A | * | 2/1975 | Laboue | 211/175 |
| 4,258,967 A | | 3/1981 | Boudreau | |
| 4,672,509 A | * | 6/1987 | Speraw | 361/687 |
| 4,699,270 A | * | 10/1987 | Bohm | 211/41.17 |
| 4,774,631 A | * | 9/1988 | Okuyama et al. | 361/695 |
| 4,879,634 A | | 11/1989 | Storrow et al. | |
| 4,977,532 A | | 12/1990 | Borkowicz et al. | |
| 5,010,444 A | | 4/1991 | Storrow et al. | |
| 5,031,075 A | | 7/1991 | Casanova et al. | |
| 5,086,372 A | | 2/1992 | Bennett et al. | |
| 5,216,579 A | | 6/1993 | Basara et al. | |
| 5,335,148 A | | 8/1994 | Stucke | |
| 5,366,827 A | | 11/1994 | Belanger et al. | |
| 5,460,441 A | | 10/1995 | Hastings et al. | |

(List continued on next page.)

FOREIGN PATENT DOCUMENTS

| | | | | |
|---|---|---|---|---|
| JP | 56-15097 | | 2/1981 | |
| JP | 57-6296 | | 1/1982 | |
| JP | 57-128194 | | 5/1982 | |
| JP | 62-73592 | | 4/1987 | |
| JP | 63-50196 | | 4/1988 | |
| JP | 03-164999 | | 7/1991 | |
| JP | U4-28496 | | 3/1992 | |
| JP | 05-183282 | | 7/1993 | |
| JP | 07-312494 | | 11/1995 | |
| JP | 08-88489 | | 2/1996 | |
| JP | 08-172287 | | 7/1996 | |
| JP | 08278834 A | * | 10/1996 | ............. G06F/1/20 |
| JP | 11135694 A | * | 5/1999 | ......... H01L/23/467 |
| WO | PCT/JP85/00640 | | 11/1985 | |

OTHER PUBLICATIONS

Kojima, Yamazaki, Cooling System Using Heat Pipes, Advances in Electronic Packaging 1992, ASME.

*Primary Examiner*—Lisa Lea-Edmonds
(74) *Attorney, Agent, or Firm*—Duckor Spradling & Metzger; Bernard L. Kleinke

(57) ABSTRACT

According to at least one of the disclosed embodiments of the present invention, there is provided a rack mounted system employing vertically mounted computer components in the form of blades for supporting circuit devices. The blades are mounted in a series of vertically spaced apart bays. In each bay, the vertically mounted blades are interconnected to a power distribution unit strip to cause the blades to be mounted compactly. Thus, a pair of sets of vertically mounted blades are attached to opposite sides of the power distribution unit within the same bay. Cooling fan units are positioned between each vertically spaced apart bays to provide vertical air flow through the system.

10 Claims, 17 Drawing Sheets

U.S. PATENT DOCUMENTS

| | | | |
|---|---|---|---|
| 5,570,740 A | * 11/1996 | Flores et al. | 165/104.34 |
| 5,571,256 A | 11/1996 | Good et al. | |
| 5,684,671 A | 11/1997 | Hobbs et al. | |
| RE35,915 E | 10/1998 | Hastings et al. | |
| D407,358 S | 3/1999 | Redmond | |
| 5,877,938 A | 3/1999 | Hobbs et al. | |
| 5,896,273 A | 4/1999 | Varghese et al. | |
| 5,999,403 A | * 12/1999 | Neustadt | 361/695 |
| 6,025,989 A | 2/2000 | Ayd et al. | |
| 6,058,025 A | 5/2000 | Ecker et al. | |
| 6,069,797 A | * 5/2000 | Widmayer et al. | 174/52.1 |
| 6,075,698 A | 6/2000 | Hogan et al. | |
| 6,185,098 B1 | * 2/2001 | Benavides | 361/687 |
| 6,220,456 B1 | 4/2001 | Jensen et al. | |
| 6,305,556 B1 | 10/2001 | Mayer | |
| 6,315,249 B1 | 11/2001 | Jensen et al. | |
| 6,325,636 B1 | 12/2001 | Hipp et al. | |
| 6,487,080 B2 | * 11/2002 | Robbins et al. | 361/727 |
| 6,496,366 B1 | * 12/2002 | Coglitore et al. | 361/687 |
| 6,499,609 B2 | * 12/2002 | Patriche et al. | 211/175 |
| 6,643,141 B2 | 11/2003 | Kaetsu et al. | |
| 2002/0006026 A1 | * 1/2002 | Takahashi et al. | 361/687 |

* cited by examiner

METHOD AND APPARATUS FOR RACK MOUNTING COMPUTER COMPONENTS

RELATED APPLICATION

This application is related to U.S. provisional applications Ser. No. 60/384,996, titled "Rack Mountable Computer Component and Method of Making Same", filed May 31, 2002; Ser. No. 60/384,987,titled "Rack Mountable Computer Component Cooling Method and Device", filed May 31, 2002; Ser. No. 60/384,986, titled "Rack Mountable Computer Component Fan Cooling Arrangement and Method", and Ser. No. 60/385,005, titled "Rack Mountable Computer Component Power Distribution Unit and Method", which are each hereby incorporated by reference in their entirety.

BACKGROUND OF THE INVENTION

1. Field of the Invention

The present invention relates in general to a new and improved method and apparatus for rack mounting computer components. It more particularly relates to such a method and apparatus for rack mounting computer components in a compact configuration.

2. Related Art

There have been a variety of different types and kinds of methods and systems for mounting computer components. For example, reference may be made to the following United States patents:

| U.S. PAT. NO. | INVENTOR | ISSUE DATE |
| --- | --- | --- |
| 4,258,967 | Boudreau | Mar. 31, 1081 |
| 4,879,634 | Storrow et al. | Nov. 7, 1989 |
| 4,977,532 | Borkowicz et al. | Dec. 12, 1990 |
| 5,010,444 | Storrow et al. | Apr. 23, 1991 |
| 5,216,579 | Basara et al. | Jun. 01, 1993 |
| 5,460,441 | Hastings et al. | Oct. 24, 1995 |
| 5,571,256 | Good et al. | Nov. 5, 1996 |
| 5,684,671 | Hobbs et al. | Nov. 4, 1997 |
| 5,877,938 | Hobbs et al. | Mar. 2, 1999 |
| 5,896,273 | Varghese et al. | Apr. 30, 1999 |
| 6,025,989 | Ayd et al. | Feb. 15, 2000 |
| 6,058,025 | Ecker et al. | May 2, 2000 |
| 6,075,698 | Hogan et at. | Jun. 13, 2000 |
| 6,220,456 B1 | Jensen et al. | Apr. 24, 2001 |
| 6,305,556 B1 | Mayer | Oct. 23, 2001 |
| 6,315,249 B1 | Jensen et al. | Nov. 13, 2001 |
| 6,325,636 B1 | Hipp et al. | Dec. 4, 2001 |
| Re. 35,915 | Hastings et al. | Oct. 6, 1998 |
| Des. 407,358 | Belanger et al. | Mar. 30, 1999 |

As a result of having available a large number of different types and kinds of mounting techniques, a standard has been adopted for mounting computer components in racks according to a certain modular configuration. In this regard, computer components such as computer processor units, and the like, are mounted one above the other in a column in standard size rack configurations. The standard is referred to as the EIA-310-D Standard, as clarified by the Server Rack Specification (SSI).

The housing for each computer device must have a certain height dimensions according to the Standard. The height dimension must be a multiple of a standard unit "U". Thus, there can be computer components which are 1 "U" (standard unit) high or multiples thereof. Thus, there can also be standard rack mountable computer components which are 1 U, 2 U, 3 U, 4 U and so on.

Thus, according to the conventional currently-used standard, racks are provided for storage of computer components in tightly spaced, densely packed horizontal dispositions, and each computer component mounted in the rack is suitably dimensioned in multiples of standard unit U. The racks are movably mounted on casters or the like so that they can be readily positioned in, for example, a computer room having a tightly controlled air conditioning system to ensure proper cooling of the computer equipment.

It is highly desirable to configure the computer components in the rack in a compact and highly dense manner for some applications. Thus, it has been important for many applications to position in the computer room or other assigned space as many computer components as possible.

In order to compactly mount the computer components on the rack in a high density manner, they are closely positioned one above the other in a column. The data and power cables are positioned in a back plane area or space within the rack.

For cooling purposes, various techniques are employed. For example, individual fans have been mounted within the housing of each computer component. The interiors of the housing have been exhausted to a fan exhaust plenum chamber often times constructed within the rack at one side thereof.

Such conventional rack mounted systems have several drawbacks. The individual fans mounted in each component are expensive, and time-consuming to replace in case of malfunctions. Also, the back plane space and fan exhaust plenum chamber are wasted space in that they occupy spaces which could otherwise be filled with computer components.

Additionally, in order to assemble the rack mounted system for installation at the site, each component must be installed in place within the rack, and then the cabling for each unit is routed within the rack at its back plane space. Such an operation is time consuming, and therefore expensive since highly trained personnel are required to do such an installation. Furthermore, once installed, in order to replace a malfunctioning computer component, the entire system, or at least a substantial portion thereof, must be shut down so that the malfunctioning unit can be disassembled, and a replacement unit installed and reconnected electrically. This, too, is time consuming and expensive.

BRIEF DESCRIPTION OF THE DRAWINGS

The following is a brief description of the drawings.

DESCRIPTION OF CERTAIN EMBODIMENTS OF THE INVENTION

Figure 1:
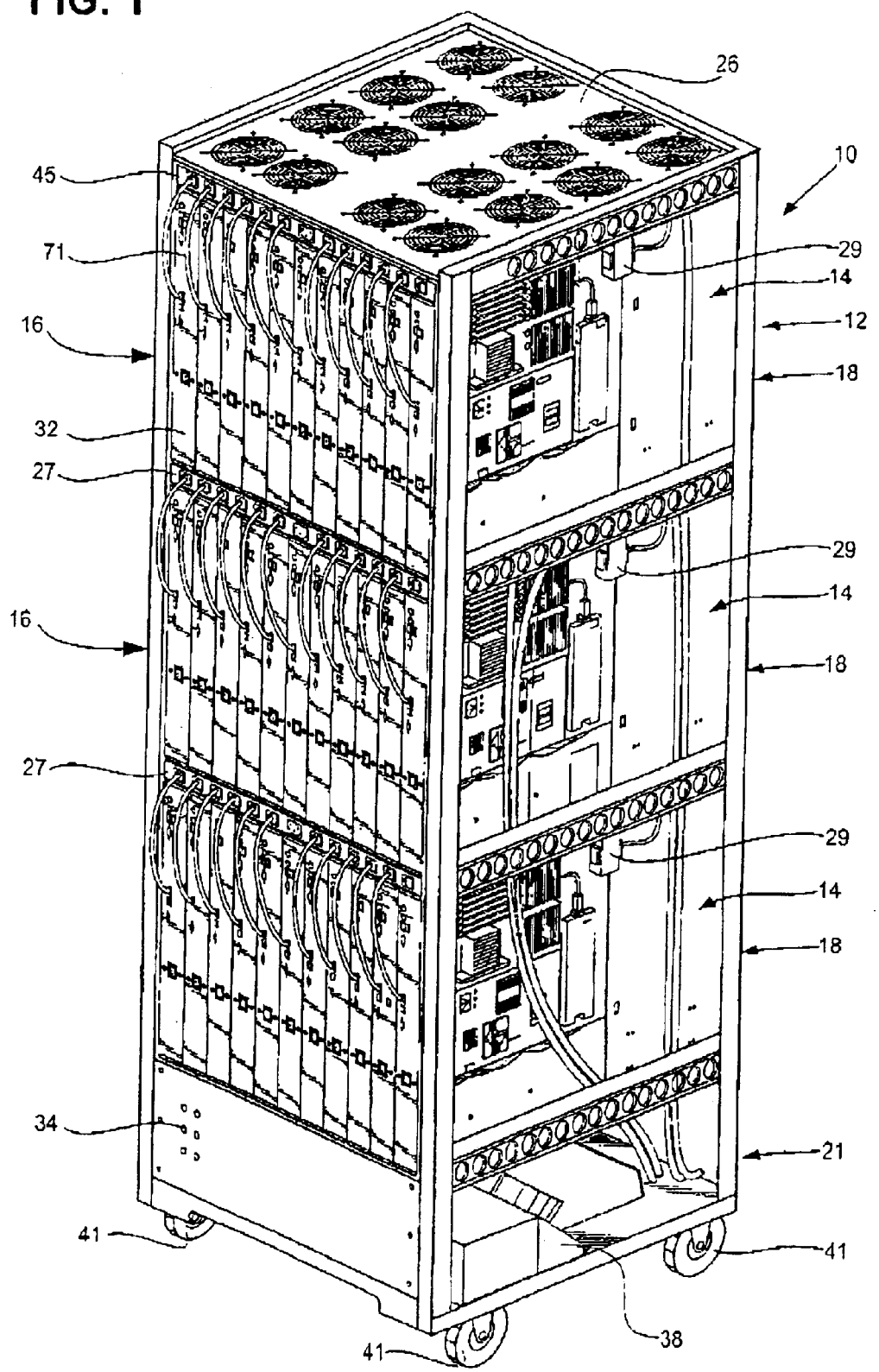
FIG. 1 is a pictorial view of a rack-mounted system showing the front, left side and top thereof, which is constructed in accordance with an embodiment of the present invention.
Figure 2:
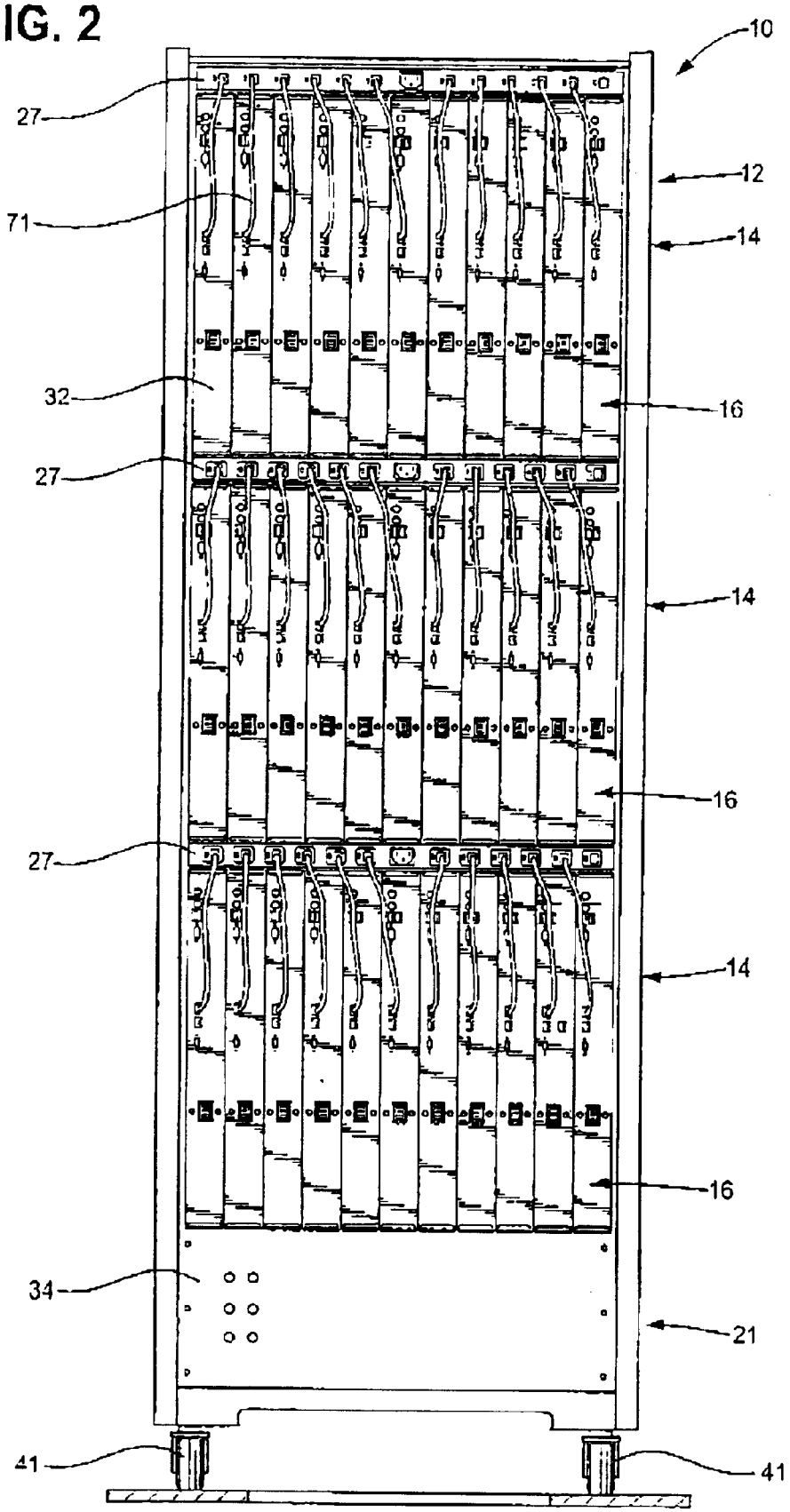
FIG. 2 is a front elevational view of the rack-mounted system of FIG. 1.
Figure 3:
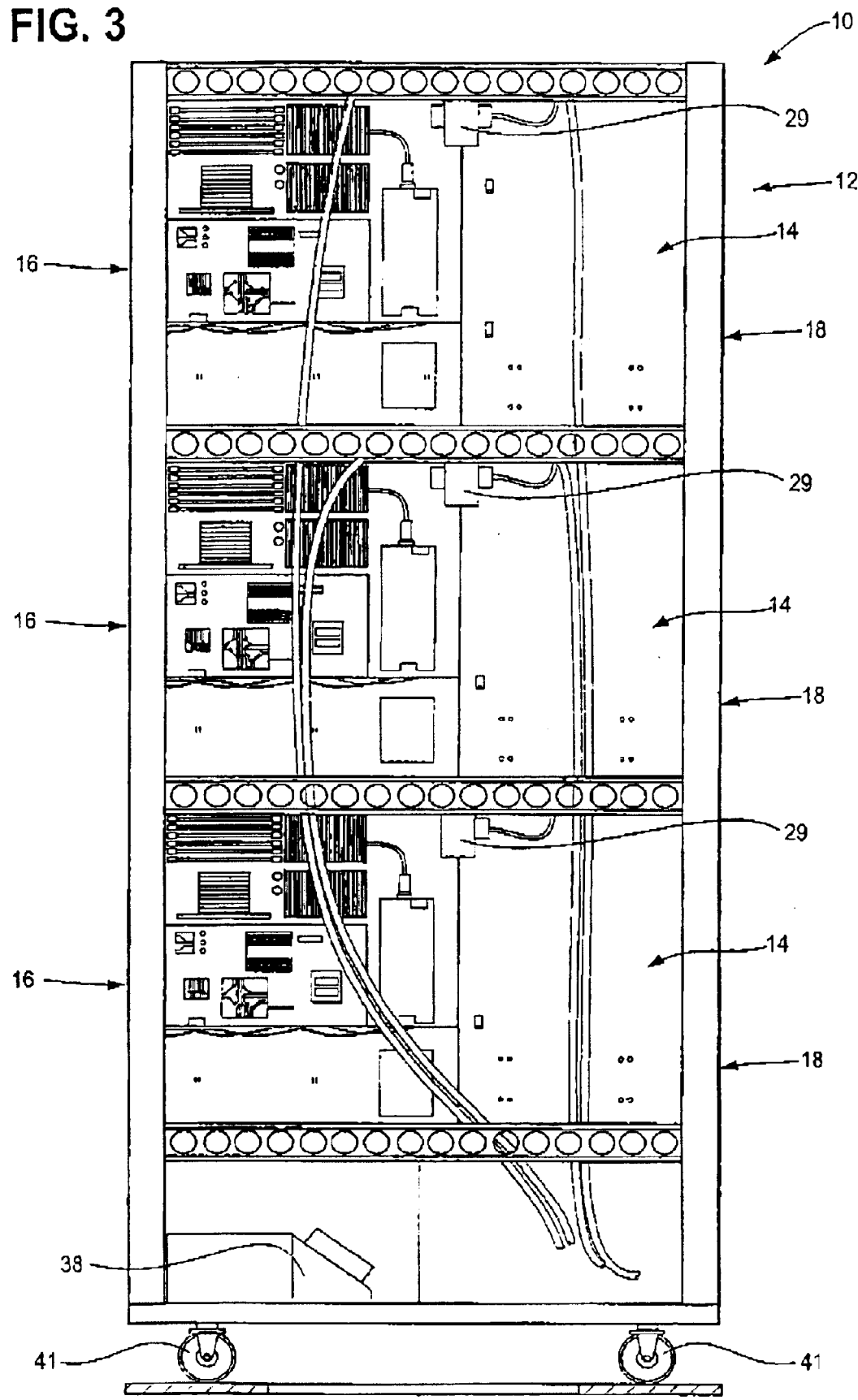
FIG. 3 is a left side elevational view of the rack-mounted system of FIG. 1.

According to at least one of the disclosed embodiments of the present invention, there is provided a rack mounted system employing vertically mounted computer components in the form of blades for supporting circuit devices. The blades are mounted in a series of vertically spaced apart bays. In each bay, the vertically mounted blades are interconnected to a power distribution unit strip to cause the blades to be mounted compactly. Thus, a pair of sets of vertically mounted blades are attached to opposite sides of the power distribution unit within the same bay. Cooling fan units are positioned between each vertically spaced apart bays to provide vertical air flow through the system.

Referring now to FIGS. 1 through 21, there is illustrated one embodiment of a rack mounted system 10 according to the present invention. The rack mounted system 10 includes a rack housing 12 configured generally as a rectangular box having a plurality of vertical bays 14. The embodiment illustrated in the drawings includes three vertically spaced-apart bays 14.

Each bay 14 is divided into a front bay portion 16 and a rear bay portion 18 by an intermediate transversely-extending horizontal divider 19. The intermediate divider 19 is most clearly illustrated in FIG. 7. The bays 14 are formed in the rack housing 12 in a vertical manner one above the other. In a bottom portion of the rack housing 12, a control bay 21 is provided to house various controlled components, as hereinafter described in greater detail.

The rack housing 12 further includes a fan/LAN tray slot 23 above each bay 14. Each fan/LAN tray slot is configured to accommodate a fan/LAN tray such as tray 27.

The embodiment illustrated in the drawings provides a control bay 21 (FIG. 7) having a bottom opening 25 (FIG. 7) for facilitating air flow to receive vertically moving air flow from a vent opening 26 in a floor 28 and vertically through the system 10 as assisted by the fan/LAN trays. At the top of the rack housing 12, an apertured top panel 26 (FIG. 1) is provided to permit venting of the vertically moving air flow from the system 10.

At the top portion of each bay 14, in the intermediate region between the front bay portion 16 and the rear bay portion 18, as best seen in FIGS. 1, 5, 6 and 8, a power distribution unit (PDU) 29 is provided to supply electricity to various components mounted in the rack mounted system. Each bay is adapted to accommodate a plurality of computer components in the form of open structure computer blades, such as blade 32 (FIG. 1), in each of the front bay portions 16 and the rear bay portions 18. In the embodiment illustrated in the figures, eleven blades may be accommodated in each of the front bay and rear bay portions. Thus, in the illustrated embodiment, the system 10 accommodates 66 computer components in a densely compact, closely spaced configuration.

Figure 4:
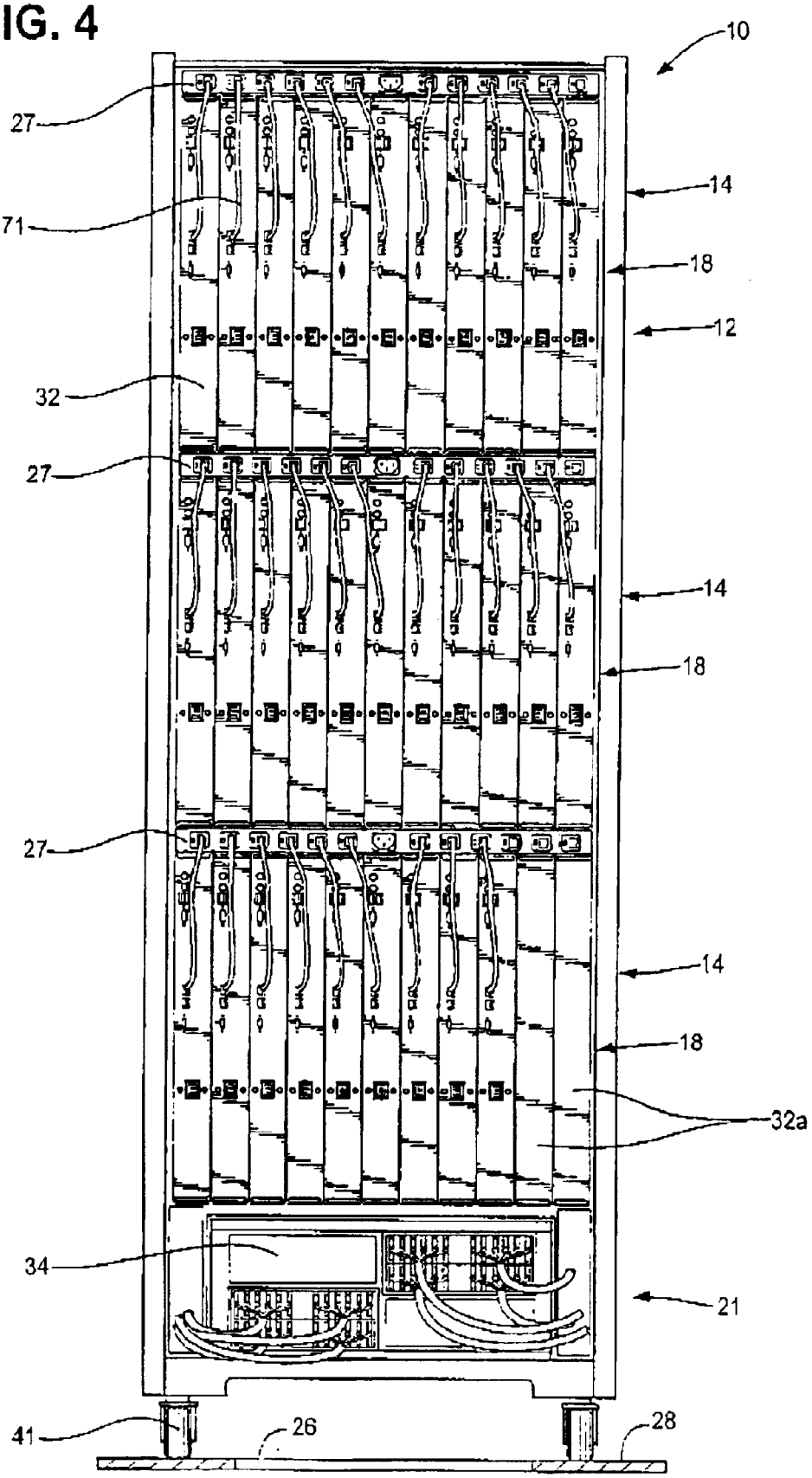
FIG. 4 is a rear elevational view of the rack-mounted system of FIG. 1.
Figure 5:
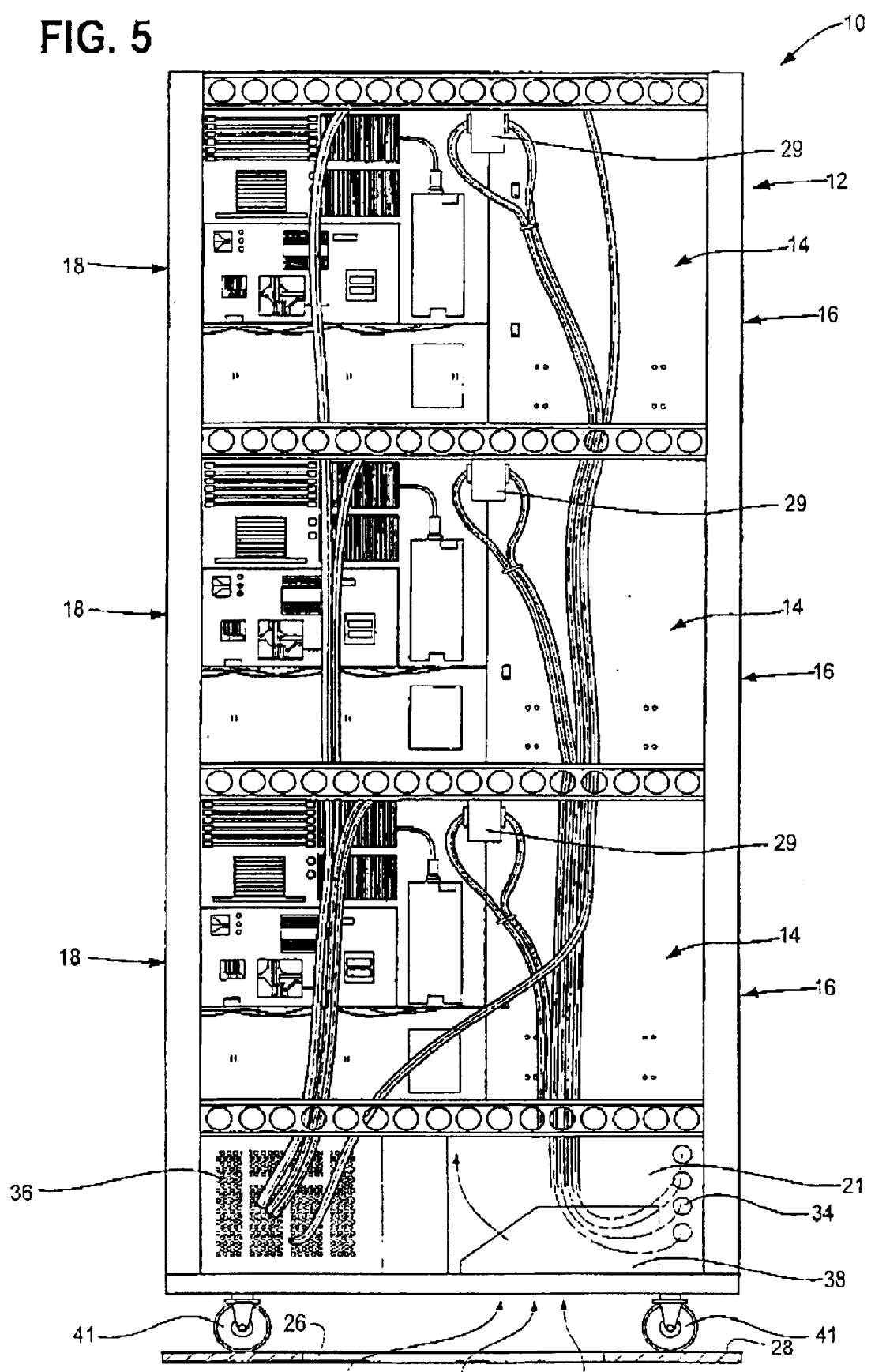
FIG. 5 is a right side elevational view of the rack-mounted system of FIG. 1.
Figure 6:
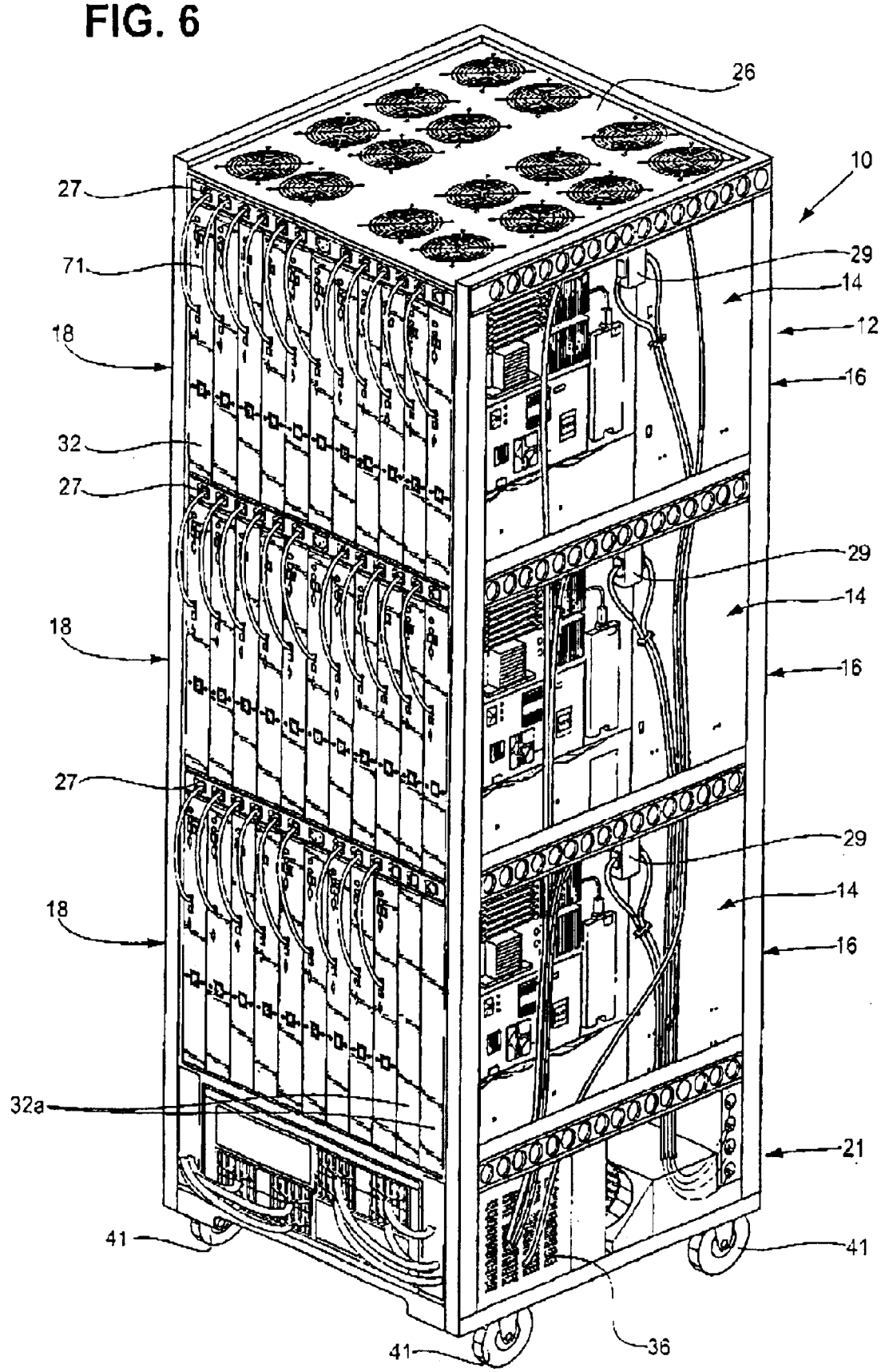
FIG. 6 is a pictorial view of the rack-mounted system of FIG. 1, showing the rear, right side and top thereof.
Figure 7:
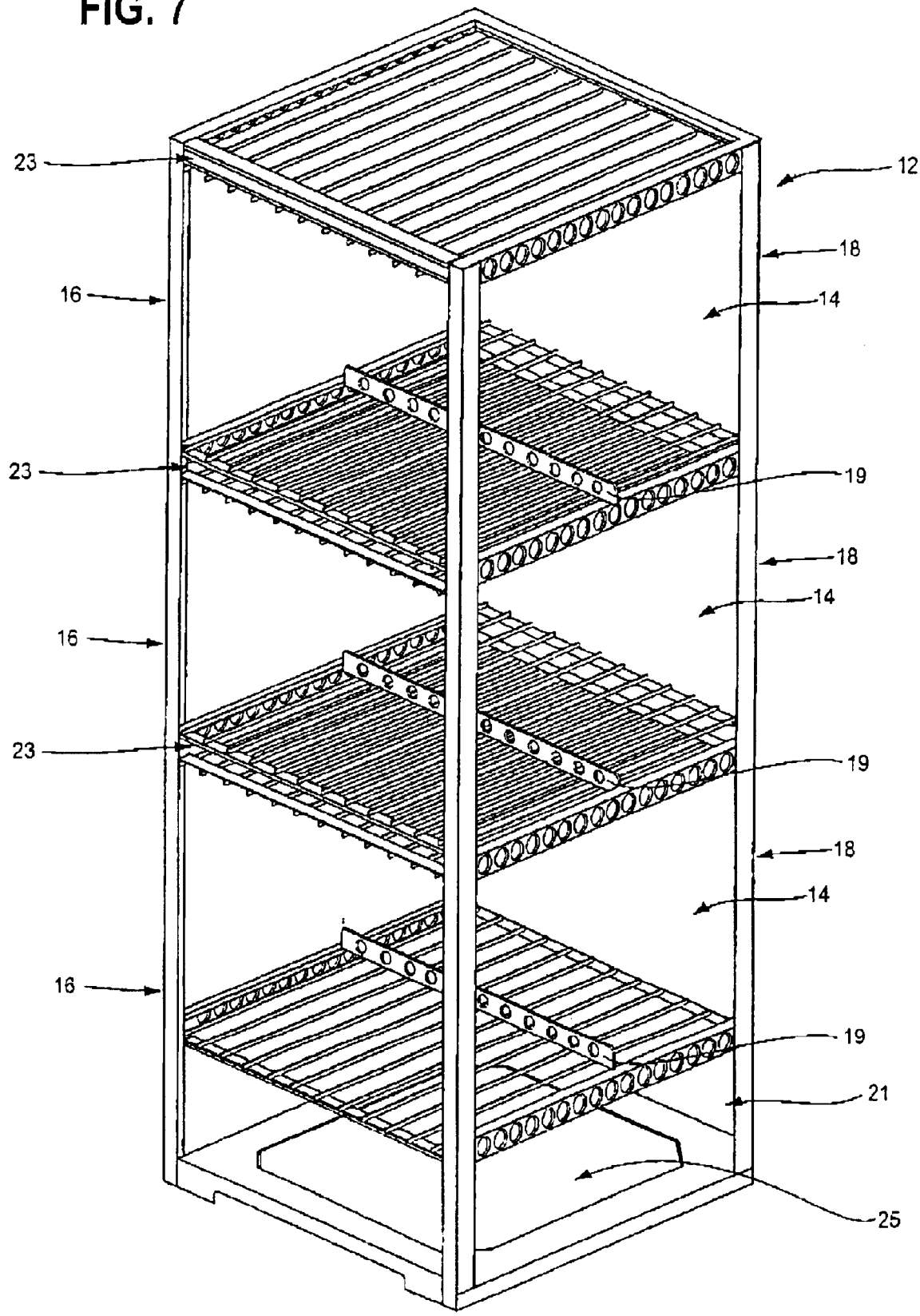
FIG. 7 is a pictorial view of the housing of the rack-mounted system of FIG. 1 without various components being mounted for illustration purposes.

The bottom control bay 21 is adapted to accommodate various control components. These control components may include a circuit breaker junction box 34, as most clearly illustrated in FIG. 6. The circuit breaker junction box 34 is electrically connected to each PDU. As shown in FIG. 4, a switch module 36 is also provided in the control bay 21. The switch module 36 is adapted to control communication between the various blades, such as blade 32, and a network, such as a local area network, wide area network, or a public network, such as the internet. Further, the control bay 21 accommodates an air intake fan module 38 (FIGS. 1 and 5) for facilitating intake of air through the bottom opening 25 and facilitating vertical air flow through the blades and the bays 14 and out the apertured top panel 26.

The embodiment of the rack system 10 illustrated in the figures includes four casters 41 for rollably supporting the system on the floor 26 (FIG. 5) for easy portability of the rack system 10. Other embodiments of the rack system according to the present invention may be floor mounted, thereby including legs or skids in place of the casters for direct mounting to the floor.

Figure 8:
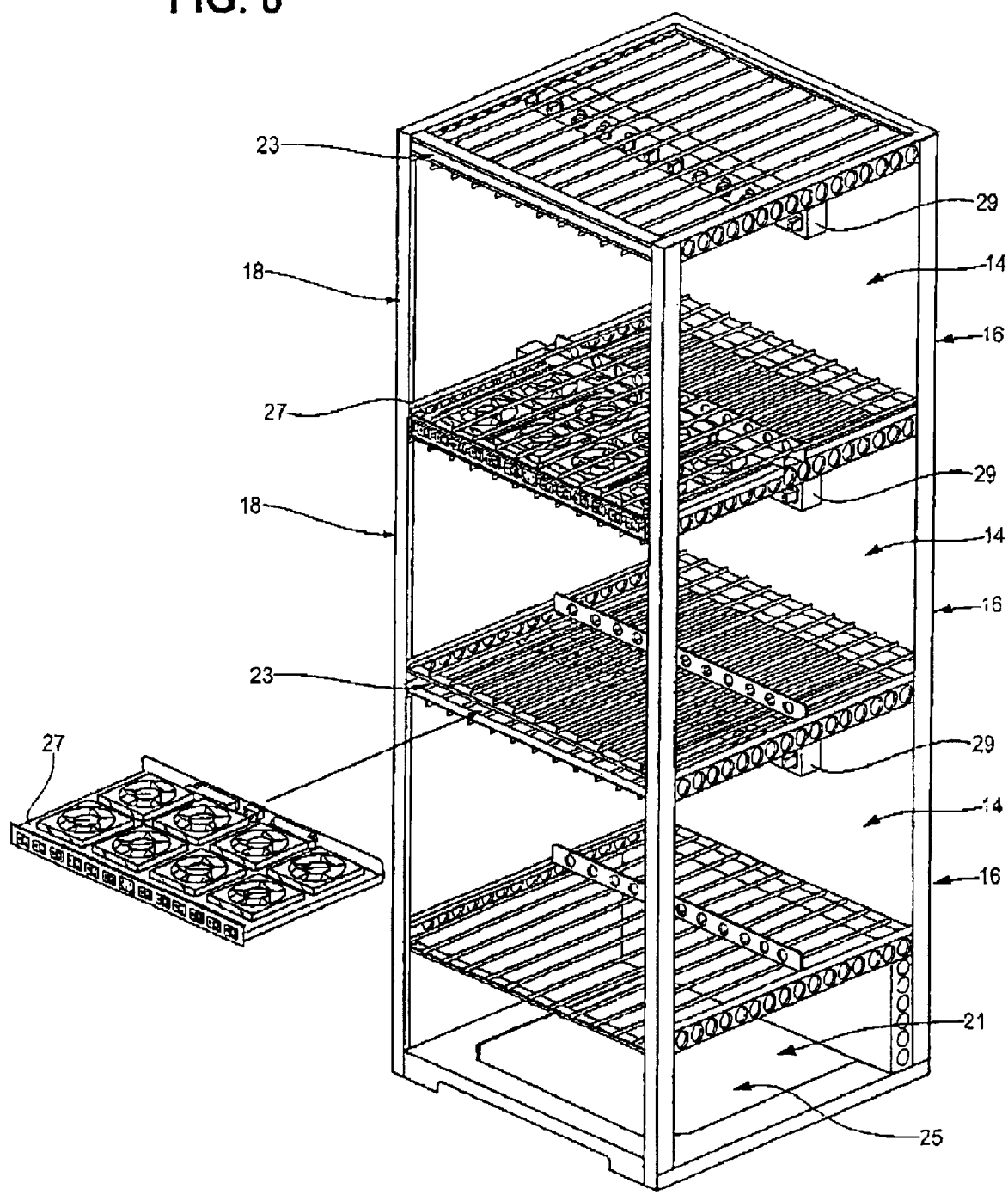
FIG. 8 is a pictorial view of the housing of FIG. 7 illustrating the process of installation of fan/LAN trays.
Figure 9:
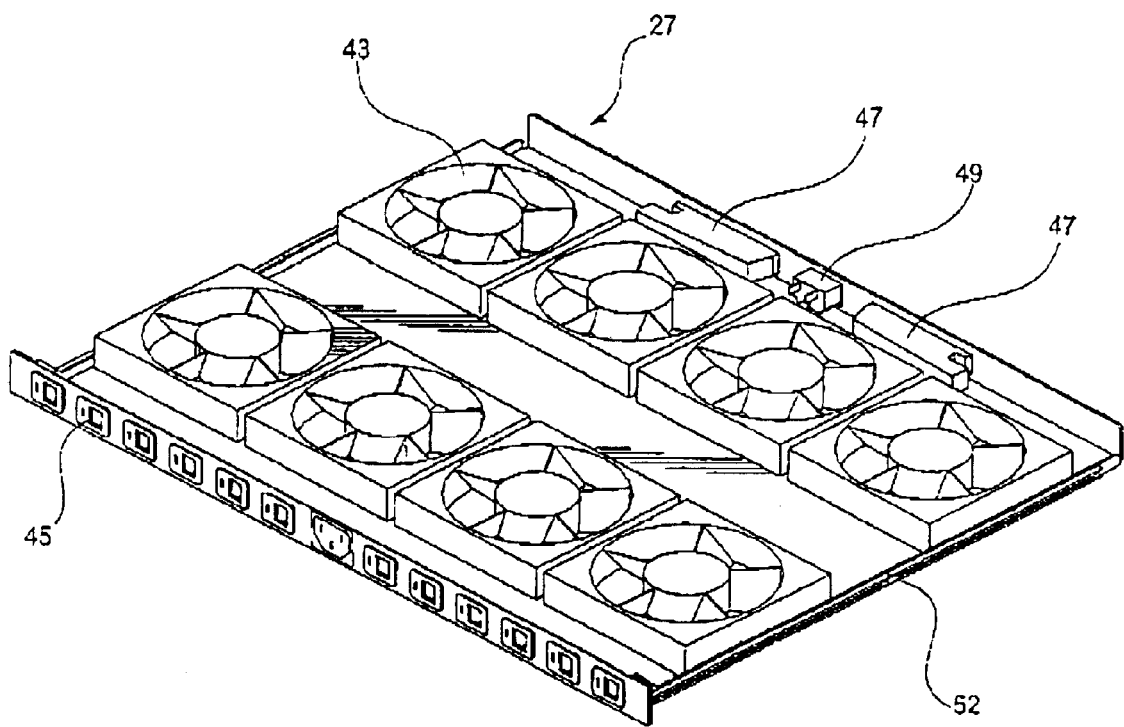
FIG. 9 is an enlarged scale pictorial view of one embodiment of a fan/LAN tray for the rack-mounted system of FIG. 1.
Figure 10:
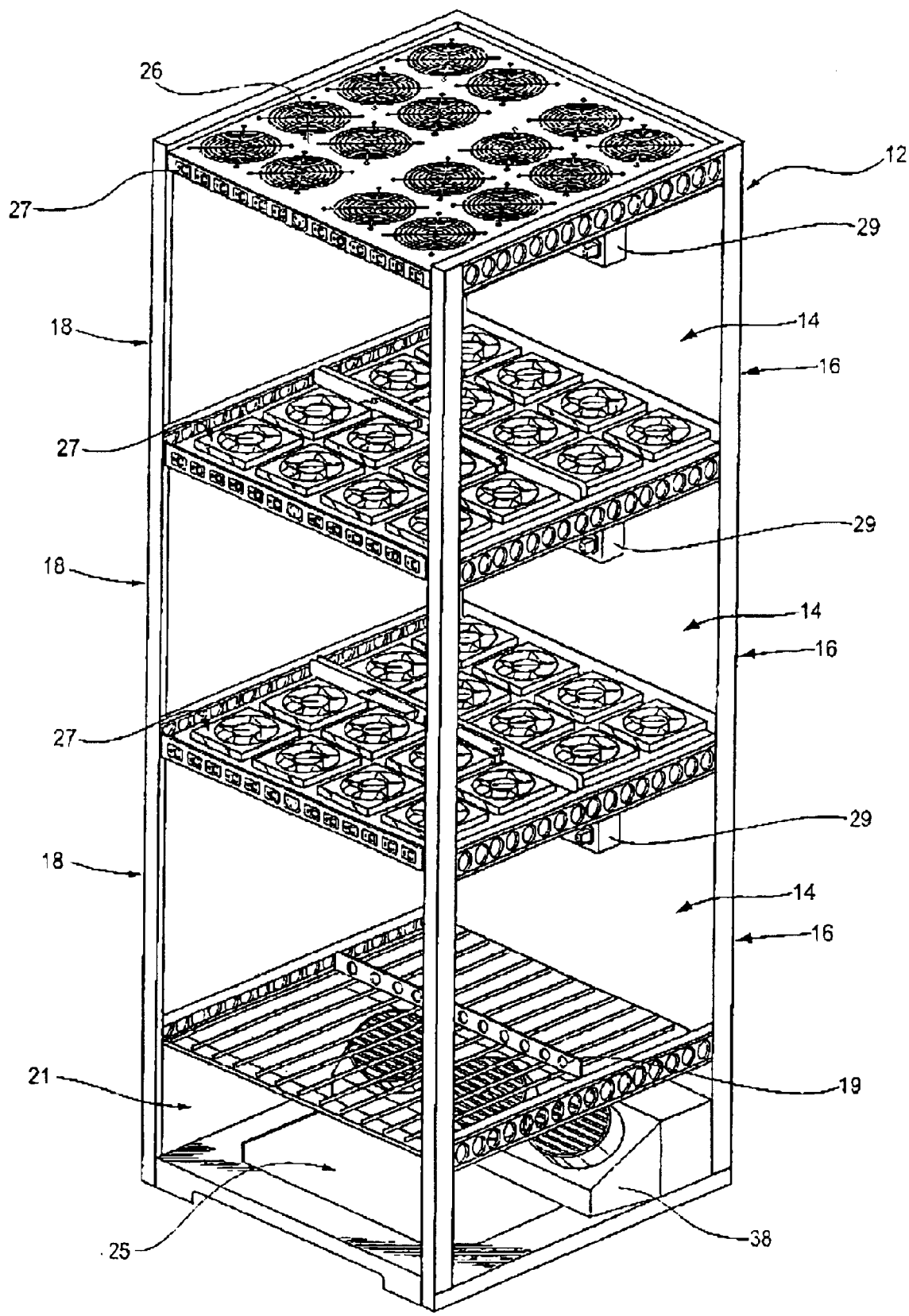
FIG. 10 is a pictorial view of the housing of FIG. 7 with the fan/LAN trays installed.

Referring now to FIGS. 8 and 9, the fan/LAN tray 27 and its installation into the rack housing 12 will be described in further detail. FIG. 9 illustrates one embodiment of a fan/LAN tray 27 for use with the rack system 10 illustrated in the drawings. The fan/LAN tray 27 includes eight suitable fans for facilitating vertical air flow. Although the embodiment illustrated in the drawings includes eight fans per tray, any suitable number of fans may be used.

In accordance with the present invention, the fan tray may also be divided into a plurality of separate trays or tray portions, each of which can be removed independently so that the remaining tray portion can continue to function. In this regard, it is contemplated that the LAN connections may be made in a unit or component separate from the fan tray or tray portions so that the tray or tray portion may be removed independently of the LAN component. In the front portion of the fan/LAN tray 27, a series of LAN connector ports 45 (FIGS. 1 and 9) is provided. In the embodiment illustrated in FIG. 9, each fan/LAN tray 27 includes 12 LAN connector ports 45, the end one of which may be used for test purposes. While 12 LAN connectors are shown in the disclosed embodiment, it should be understood that any number of such connectors may be employed for a given application. Internal wiring leads (not shown) from each LAN connector port 45 extend to one of two signal connectors 47 (FIG. 9) in the back portion of the fan/LAN tray 27. In one embodiment, each signal connector 47 is a 50 pin signal connector, and is connected electrically to the switch module 36. Further, each fan/LAN tray includes a AC power inlet 49 in the back portion for providing power to the fans. When installed, power may be supplied to the fans 43 through the AC power inlet 49 from the PDU 29, as hereinafter described in greater detail.

For facilitating installation of the fan/LAN tray 27 into the fan/LAN tray slot 23 of the rack housing 12, as shown in FIG. 9, guides 52 may be provided on the sides of each fan/LAN tray 27. During the installation process, the guides, preferably nylon guides, may engage corresponding member on the sides of the fan/LAN tray slots 23. Further, a locking mechanism may be provided in conjunction with the guides 52 for securing the fan/LAN tray 27 into the fan/LAN tray slot 23. Once installed, each fan/LAN tray 27 occupies an area directly above either the front bay portion 16 or the rear bay portion 18. Accordingly, a fan/LAN tray in the front and a fan/LAN tray in the rear may completely cover each bay 14 level. Thus, as illustrated most clearly in FIG. 10, a total of 6 fan/LAN trays 27, in addition to the air intake fan module 38 may be provided in a three bay level rack mounted system 10 according to one embodiment of the present invention.

Figure 11:
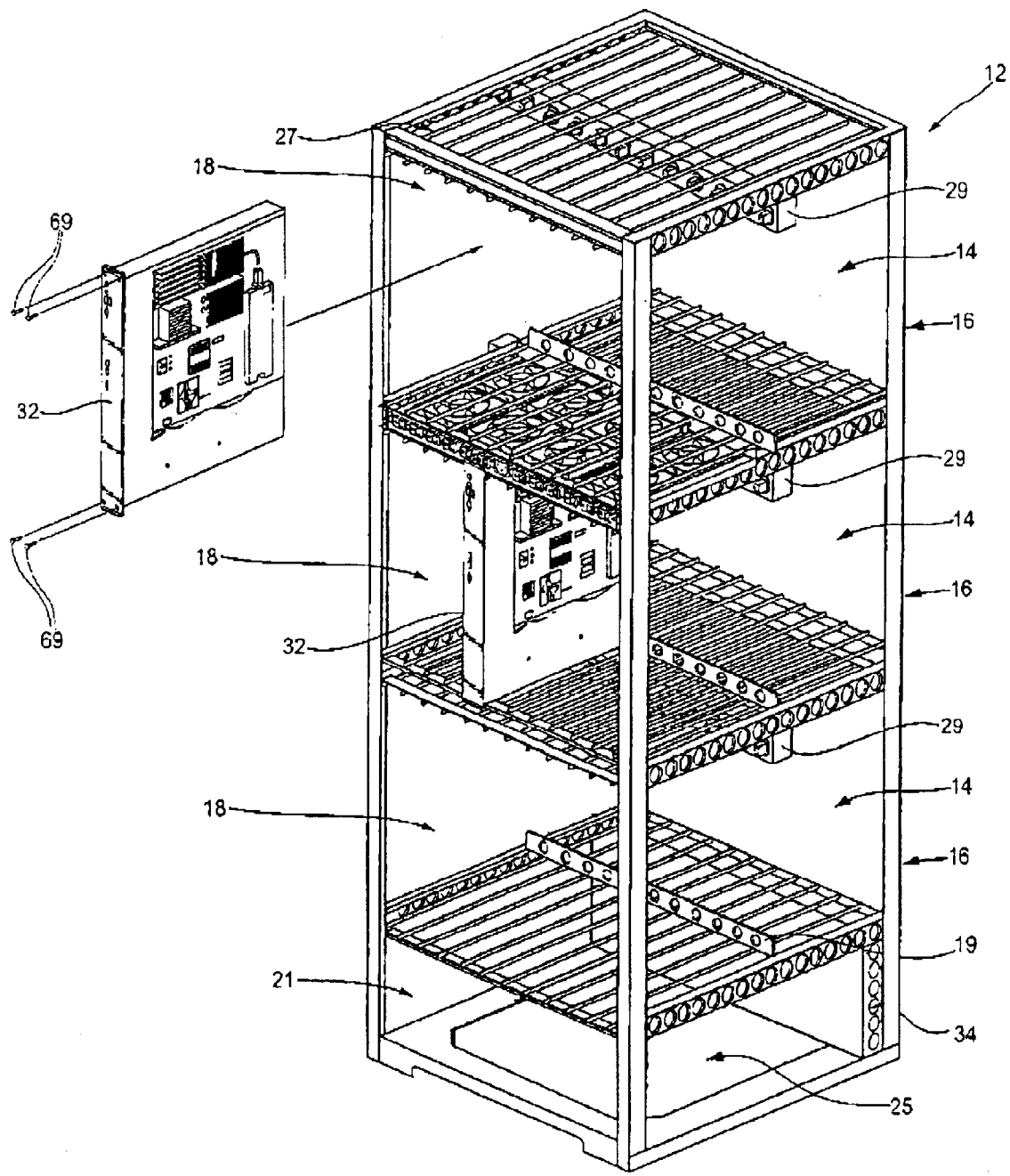
FIG. 11 is a pictorial view of the housing of FIG. 7 illustrating the process of installation of blades.
Figure 25:
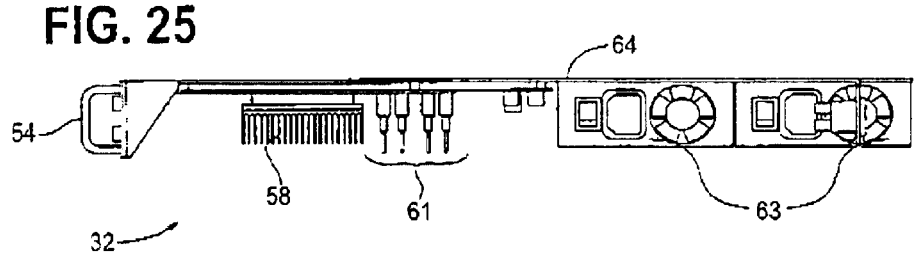
FIG. 25 is an enlarged scale top view of one embodiment of a blade of the rack-mounted system of FIG. 1.
Figure 26:
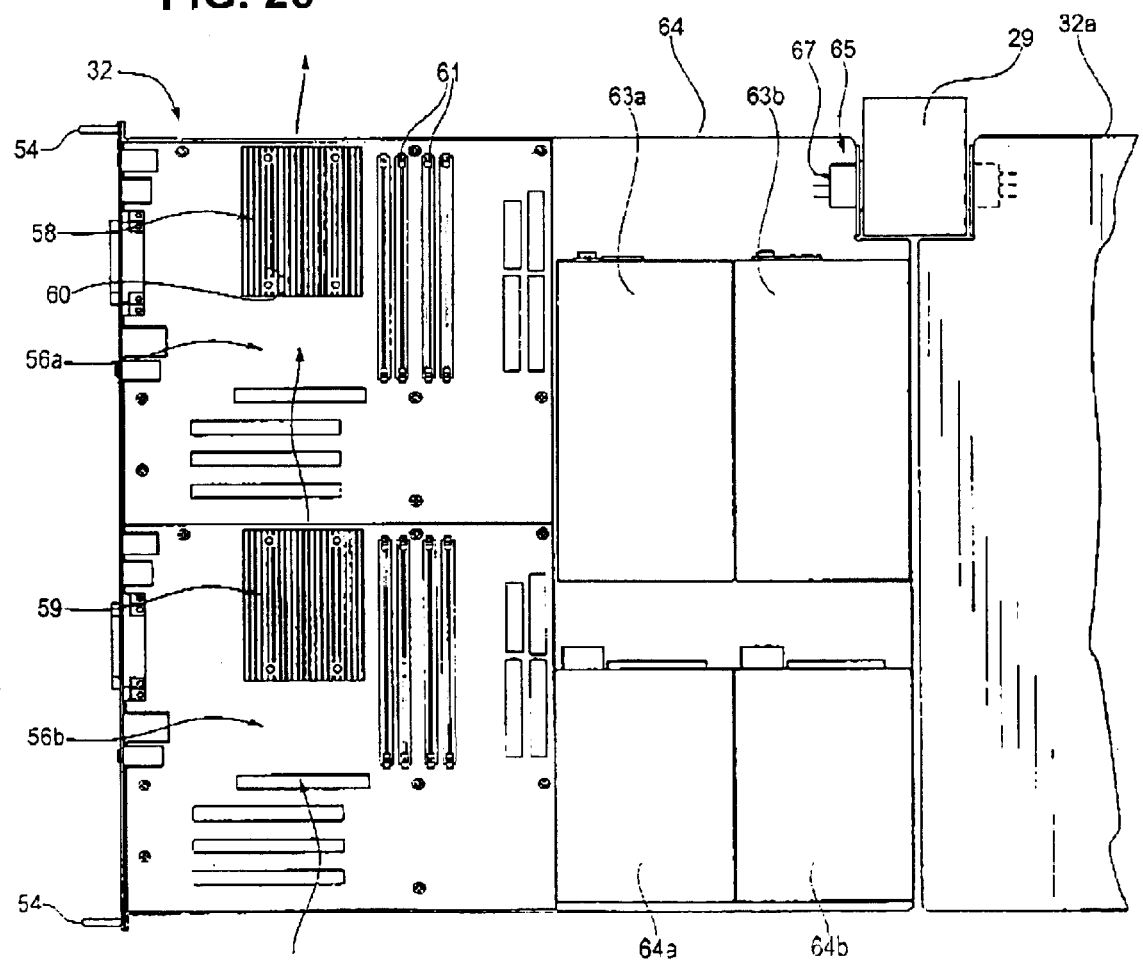
FIG. 26 is a left side elevational view of the blade of FIG. 29.

Referring now to FIGS. 11, 25 and 26, the blades 32 and their installation into the rack housing 12 will now be described in greater detail. Each blade is provided with a pair of handles 54 which allow a user to easily manipulate the blade 32 to be grasped by the user to slide the blade into or out of its bay. Each blade 32 may include one or more mother boards 56. In the embodiment illustrated in FIGS. 25 and 26, each blade 32 includes two mother boards 56a, 56b. Those skilled in the art will appreciate that the number of mother boards included in each blade 32 may be varied according to design. The mother board may include heat sinks such as heat sinks 58 and 59 for facilitating the cooling of the mother boards. Embodiments of the heat sinks are disclosed in greater detail in U.S. provisional Ser. No. 60/384,987, filed concurrently herewith. Further, each mother board is provided with random access memory (RAM) 61. The amount of RAM 61 provided for each mother board may be varied as needed. A pair of power supply 63a, 63b may be provided on the blade 32 for supplying power to their corresponding mother boards 56a, 56b. Similarly, a pair of hard disks 64a, 64b may also be provided on the blade 32.

All of the components are mounted on one side of a rigid plate or support 64, which is adapted to be supported vertically within its bay. Each blade 32 includes a cut-out corner portion or section 65 in its upper back portion. The cut-out portion 65 is sized to receive and accommodate the PDU 29 therebetween such that two opposing blades 32 and 32a (as shown in FIG. 26) accommodate the PDU 29 almost completely. Thus, a substantially zero footprint is achieved for the PDU 29. Each blade 32 is provided with an AC power inlet such as an inlet 67 at or near the cut-out portion 65. Thus, when the blade 32 is installed into the rack housing 12, the AC power inlet 67 engages electrically a corresponding AC connector such as a connector 76 (FIG. 17) of the PDU 29.

As most clearly illustrated in FIG. 11, the installation of the blade 32 may be achieved in a fast and efficient manner. The blade 32 is simply slid into either the front bay portion 16 or the rear bay portion 18 of a bay 14 of the rack housing 12. Each blade 32 is slid back until its AC power inlet 67 engages a corresponding AC connector 76 on the PDU 29. The intermediate dividers 19 serve as a back stop for the blades 32. Each blade 32 is secured in its slot by four blade screws 69, which attach the blade 32 to the rack housing 12.

Figure 12:
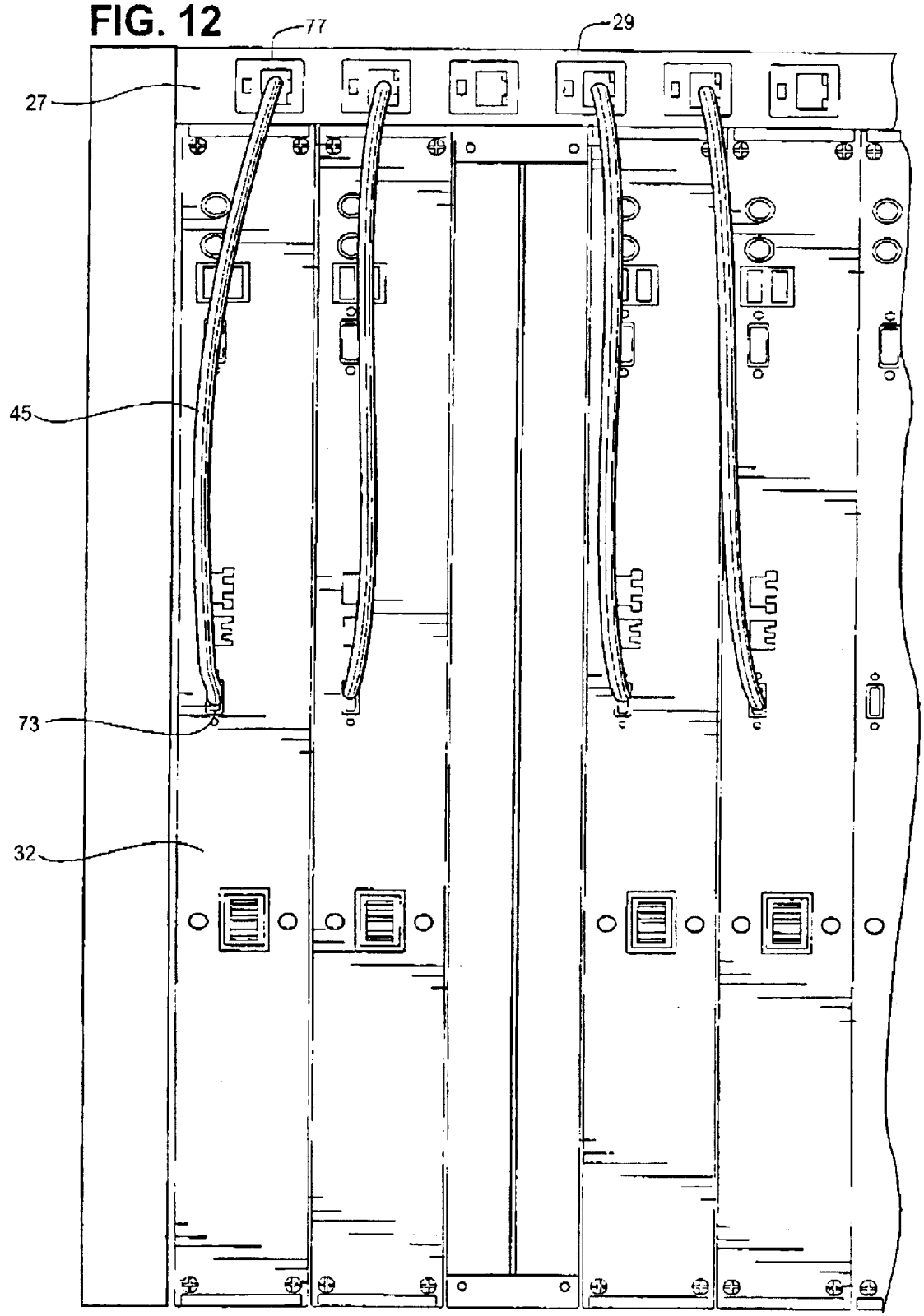
FIG. 12 is a fragmentary, enlarged scale front elevational view of the rack-mounted system of FIG. 1 illustrating the relative positioning of the fan/LAN trays and the blades.

Once the blade 32 has been mounted onto the rack housing 12, a short blade/LAN connector cable such as a cable 45 (FIG. 12) or a cable 71 (FIG. 1) provides electrical networking connection between the blade 32 and a network such as a local area network, wide area network or a public network such as the internet. In this regard, the mother boards are each mounted at the front of each blade, and thus access thereto is readily available at front outlets such as at outlet 73 (FIG. 12). Thus, a data connection can be made from the outlet 73, through a short cable 45, an inlet 77 of a PDU 29, which is coupled to the switch module 36.

Referring now to FIGS. 17 through 20, the power distribution unit 29 will now be described in greater detail. The PDU 29 supplies power from an external power source, through the circuit breaker junction box 34, to the various blades 32 and the fan/LAN trays 27. Each PDU 29 includes an elongated PDU body 74, which preferably is formed of a two piece, 18 gauge steel chassis. Each of two sides of the PDU body 74 includes a series of female AC connectors 76. In the embodiment illustrated in FIGS. 17 through 20, each side is provided with 12 female AC connectors 76. The twelve connectors 76 correspond to eleven blades mounted in the front bay portion 16 and the rear bay portion 18 of each bay 14 and a fan/LAN tray 27. The twelfth connector is for an AC power outlet on the front of the fan tray.

Thus, 12 female AC connectors 76 are provided on each of a front side and a rear side of the PDU body 74. Each set of twelve female AC connectors 76 receives power through a pair of power cables 72. In one embodiment, the power cable 72 is a 15 amp power cable with strained relief near its junction with the PDU body 74. As described below, the power cables 72 are routed to the circuit breaker junction box 34 in the control bay 21. The PDU body 74 may also include a series of mounting studs 78 for installation of the PDU body 74 to the rack housing 12.

Referring now to FIGS. 13 through 16, the routing of the various power and LAN cables will now be described in detail. As illustrated most clearly in FIG. 13, the power cables 72 from the PDU's 29 at each bay level are directed along the right side of the rack housing 12 toward the front portion of the rack housing 12 and to the bottom, where they are connected electrically to the circuit breaker junction box 34. Thus, in the embodiment illustrated in the drawings, six power cables 72 are connected to the circuit breaker junction box 34, since there are two from each one of the three PDUs. A set of three cables generally indicated at 80 are each adapted to be coupled to a suitable source of AC power to supply power to the system 10.

Figure 13:
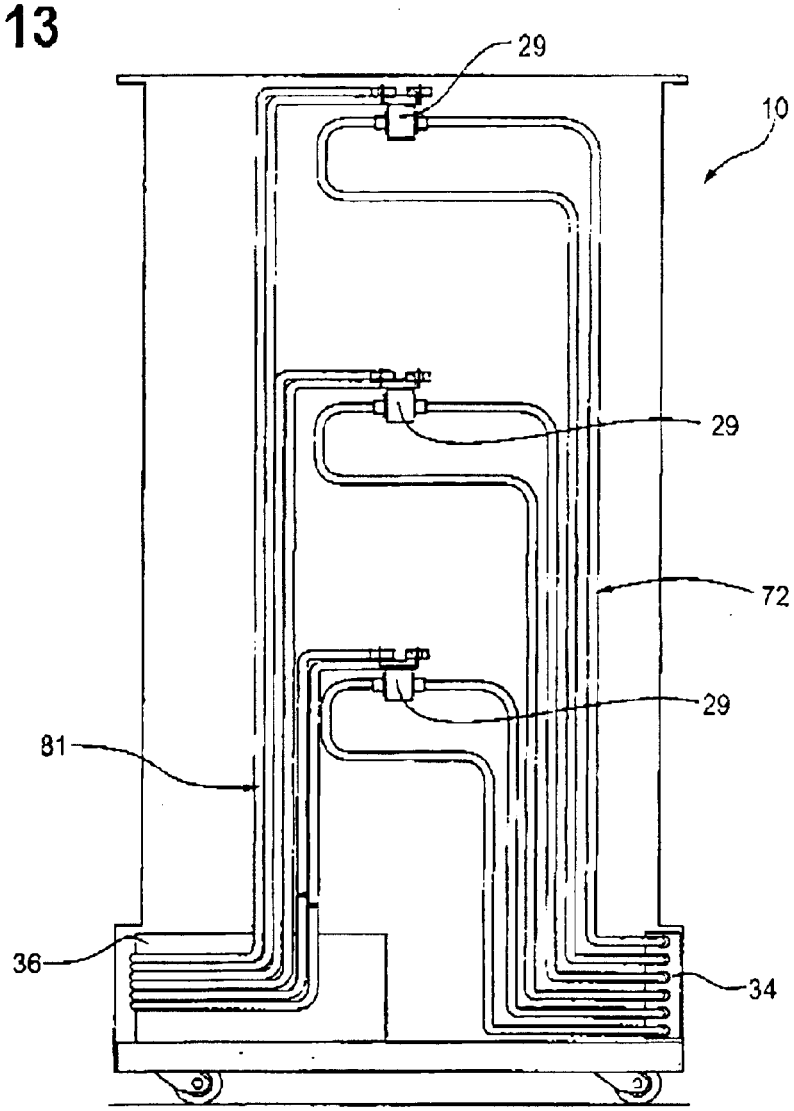
FIG. 13 is a diagrammatic, right-side elevational view of the rack-mounted system of FIG. 1 illustrating the configuration of the right-side cabling.
Figure 14:
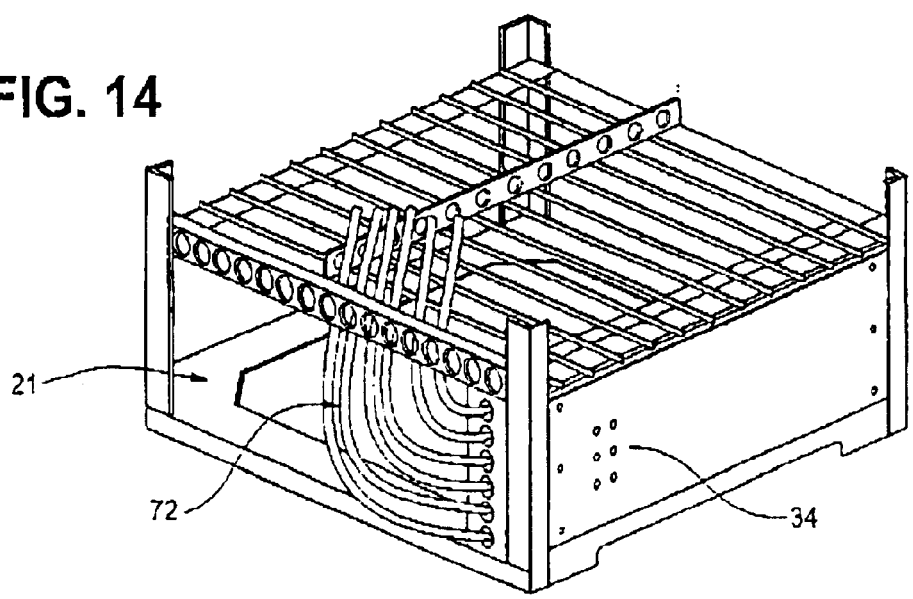
FIG. 14 is a bottom fragmentary pictorial view of the rack-mounted system of FIG. 1 illustrating the cabling in the front and right portion of the control bay.
Figure 15:
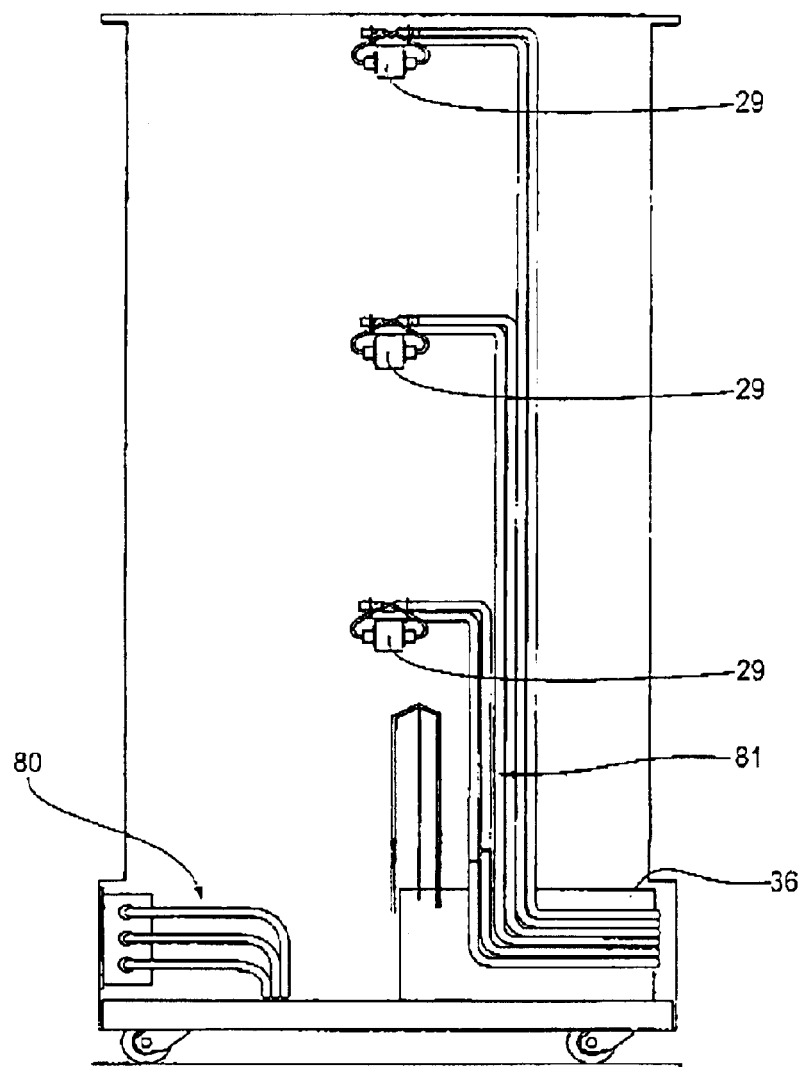
FIG. 15 is a diagrammatic, left-side elevational view of the rack-mounted system of FIG. 1 illustrating the configuration of the left-side cabling.
Figure 16:
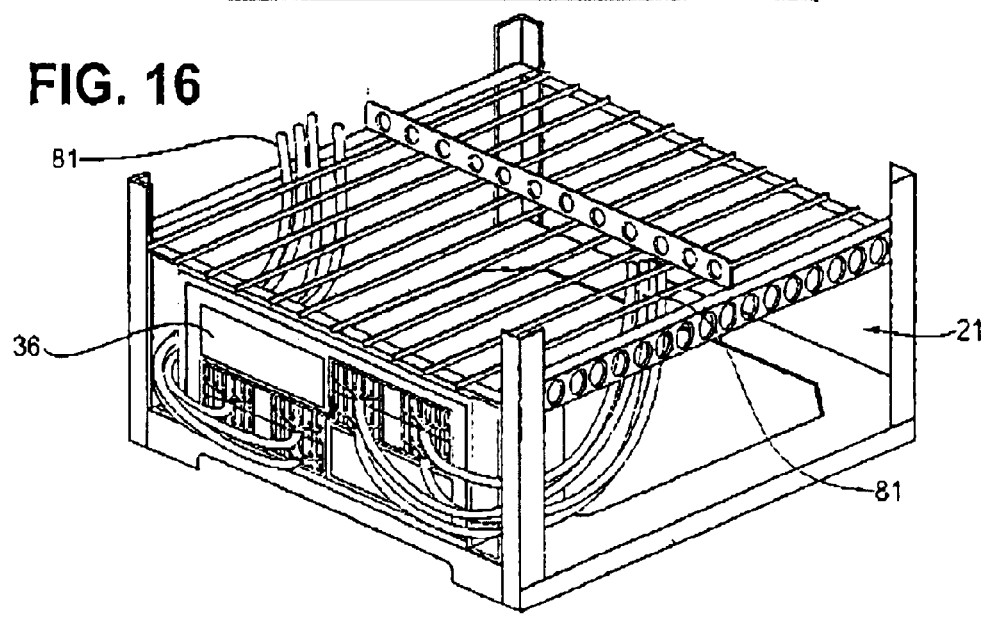
FIG. 16 is a bottom fragmentary pictorial view of the rack-mounted system of FIG. 1 illustrating the cabling in the rear and left portion of the control bay.
Figure 17:
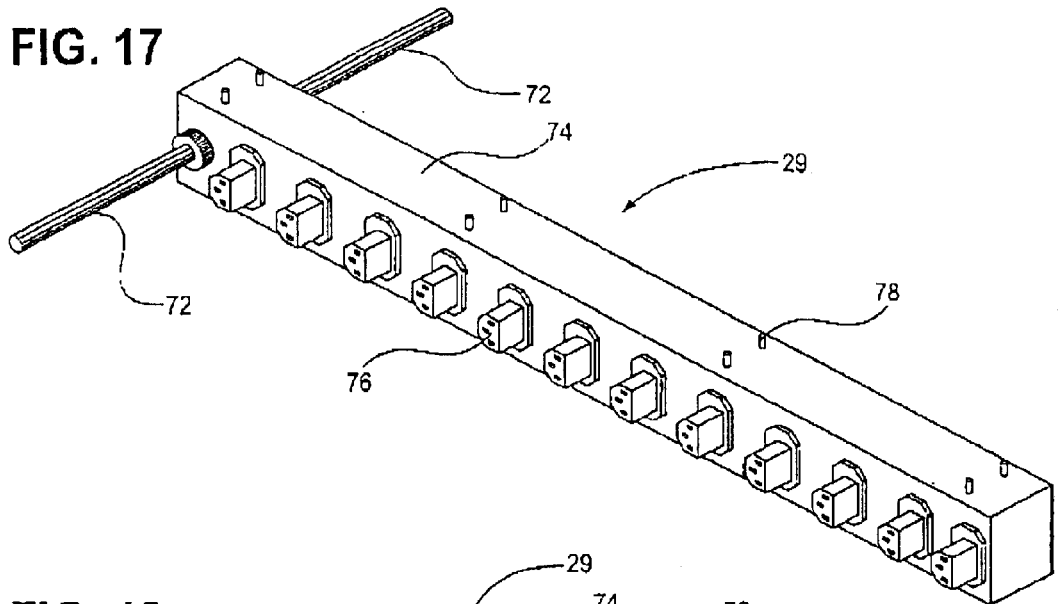
FIG. 17 is an enlarged scale, fragmentary pictorial view of one embodiment of a power distribution unit (PDU) for the rack-mounted system of FIG. 1.
Figure 18:
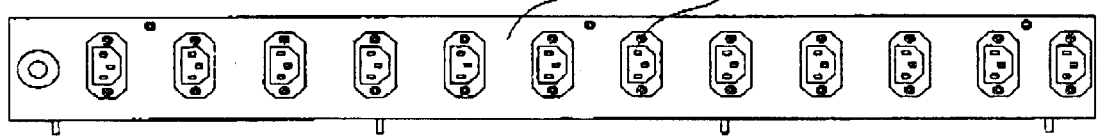
FIG. 18 is a front elevational view of the PDU shown in FIG. 17.
Figure 19:
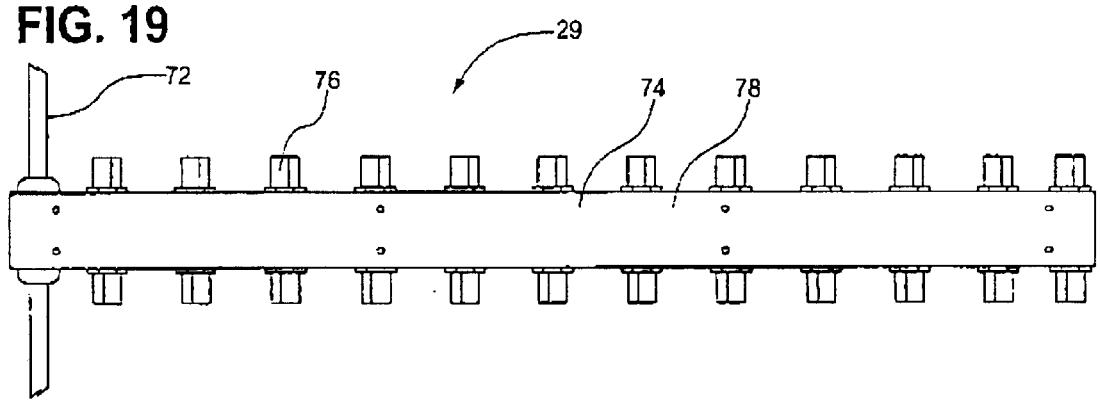
FIG. 19 is a fragmentary top view of the PDU shown in FIG. 17.
Figure 20:
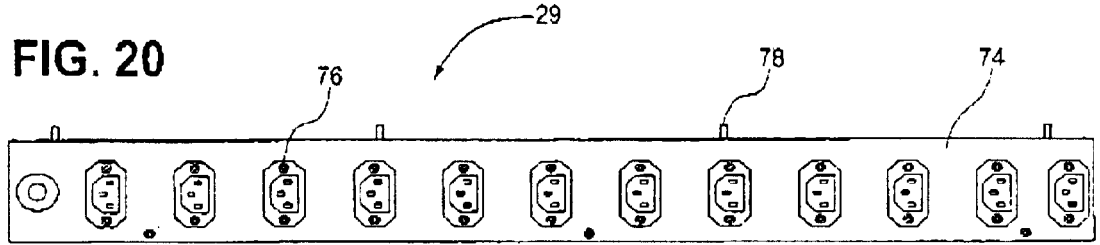
FIG. 20 is a rear elevational view of the PDU shown in FIG. 17.

As also illustrated in FIG. 13, a set of six LAN cables 81 from the fan/LAN trays and PDUs are routed along the rear right side of the rack housing 12 to the switch module 36. In the embodiment illustrated in the drawings, two LAN cables 81 extend from each PDU which, in turn, are connected electrically to a pair of fifty pin signal connectors 47. Thus, six such cables 81 are directed along the right side of the rack housing 12. Similarly, as most clearly shown in FIG. 15, six LAN cables 81 extend from the fan/LAN trays 27 and PDUs along the left front side of the rack housing 12. These six cables 81 are also connected at their lower ends to the switch module 36.

Once the rack system 10 is fully assembled with all the fan/LAN trays 27, PDUs 29 and the blades 32 in place, a fully assembled and efficient rack mounted system is provided. In such a system, networking of the various components provided on the blades 32 is also performed efficiently. In the embodiment illustrated in the drawings, eleven blades are accommodated at each of the front bay portion 16 and the rear bay portion 18 at each bay 14. Thus, in the embodiment illustrated, 66 such blades 32 may be accommodated. However, some of the slots may be occupied by master computer components or blades such as the master blades indicated at 32a in FIGS. 4 and 6. In the illustrated embodiment, two master blades 32a are provided in the bottom of the three blade bays directly above the switch module 36. The master blades 32a are connected electrically directly to the switch module 36 via high speed connections (not shown) such as fiber optic connections. The master blades control the switch module 36 to switch communication between the various slave blades 32 and the master blades. Accordingly, 64 slave blades may be accommodated by the illustrated embodiment of the system. Each of the 64 slave blades may be hot swappable, for example, allowing replacement of the blades 32 without causing the shutting down of the system 10.

Each fan/LAN tray 27 is provided with twelve LAN connector ports such as the port 45 (FIG. 1). Eleven of the 12 LAN connector ports 45 are adapted to permit communication between the various slave blades 32 and the switch module 36. The twelfth LAN connector port 45 allows an external user to connect an external device such as a laptop computer to the network. Further, each fan/LAN tray 27 is provided with a centrally disposed AC power outlet for connecting such an external device.

Figure 21:
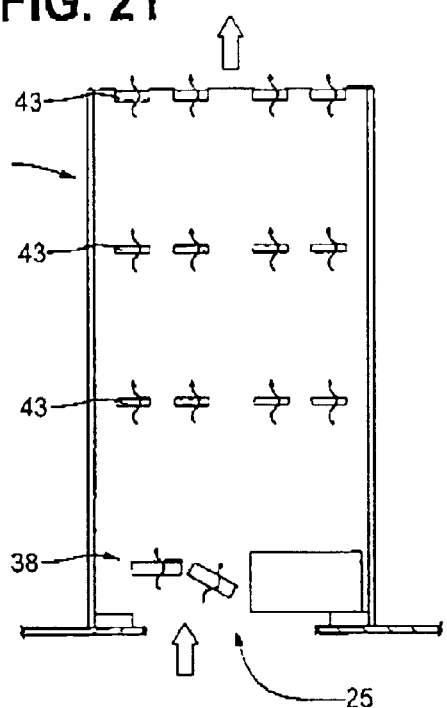
FIG. 21 is a diagrammatic view of the rack-mounted system of FIG. 1 illustrating the flow of air therethrough.
Figure 22:
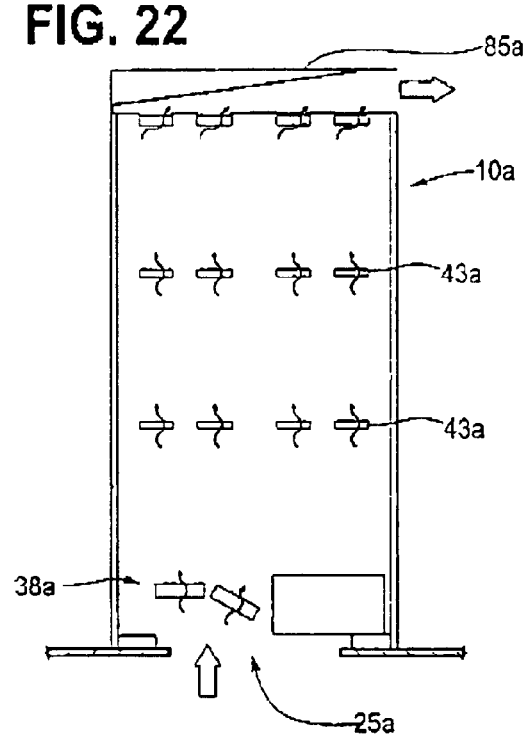
FIG. 22 is a diagrammatic view of another embodiment of a rack-mounted system according to the present invention and illustrating the flow of air therethrough.

According to the disclosed embodiments of the present invention, and as indicated diagrammatically in FIG. 21, the system 10 illustrated in the figures provides efficient air flow to maintain a cool operating temperature for the various components mounted on the blades 32. Air flow is directed from the bottom opening 25 by the air intake fan module 38 located in the control bay 21. The air intake fan module 38 directs the air flow vertically through the various open structure blades 32 at each bay level 14. The air flow is further facilitated by the fans 43 in each fan/LAN tray 27 to move the air in its upwardly directed path of travel. The air flow is directed out of the rack housing 12 through the apertured top panel 26.

FIGS. 21 through 24 illustrate further embodiments of the present invention. As illustrated in FIGS. 21 through 24, the intake and exhaust of the air flow may be varied to accommodate various configurations as to the availability of air supply in the immediate environment. For example, in FIG. 22, an air intake fan module 38a draws air from a bottom opening 25a, similar to that illustrated in the embodiment shown in FIGS. 1 through 21. Air flow is directed vertically with the aid of fans 43a mounted on fan/LAN trays. However, unlike the previously described embodiment, in the embodiment illustrated in FIG. 22, the air flow is re-directed from a vertical path of travel at right angles to a horizontal path of travel out of the rack system 10a towards the rear of the rack housing. An air flow hood 85a facilitates the rearward re-direction of the air flow.

Figure 23:
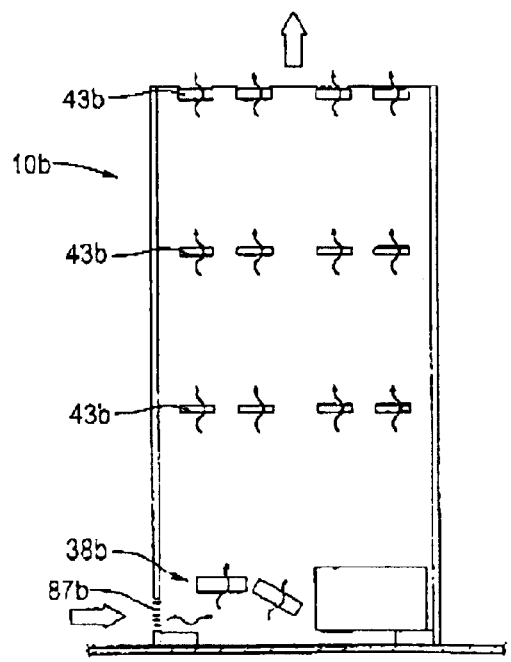
FIG. 23 is a diagrammatic view of yet another embodiment of a rack-mounted system according to the present invention and illustrating the flow of air therethrough.

FIG. 23 illustrates yet another embodiment of the rack system according to the present invention. In this embodiment, an air intake fan module 38b draws air horizontally inwardly through an opening such as defined by a perforated plate 87b in the bottom front portion of the rack housing. The air flow is then re-directed upwardly with the aid of fans 43b mounted in fan/LAN trays. The air flow is directed vertically out of the top portion of rack system 10b.

Figure 24:
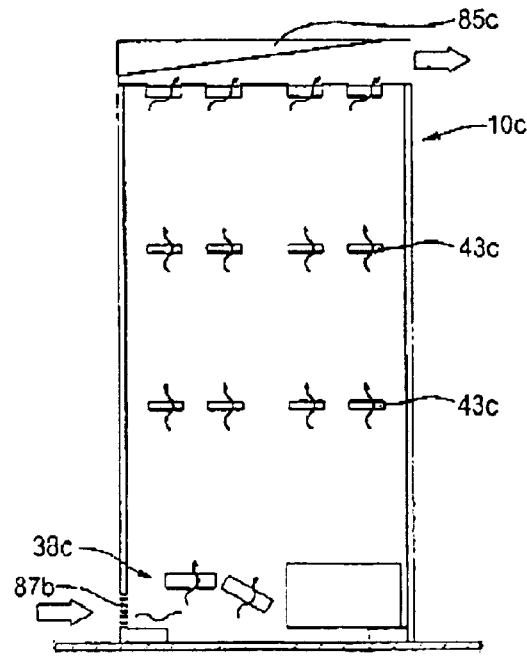
FIG. 24 is a diagrammatic view of still another embodiment of a rack-mounted system according to the present invention and illustrating the flow of air therethrough.

In the embodiment illustrated in FIG. 24, an air intake fan module 38c draws air horizontally through an opening such as defined by a perforated plate 87c in the front bottom portion of the rack housing. The air flow is re-directed vertically through this system with the aid of fans 43c. The air flow is re-directed at right angles to a horizontal path of travel out of the rack housing rearwardly at the top of the rack housing. The rearward redirection of the air flow is facilitated by an airflow hood 85c. It will be appreciated by those skilled in the art that other variations on the intake and exhaust of the air flow are possible in accordance with other embodiments of the present invention.

While particular embodiments of the present invention have been disclosed, it is to be understood that various different modifications and combinations are possible and are contemplated within the true spirit and scope of the appended claims. There is no intention, therefore, of limitations to the exact abstract and disclosure herein presented.

What is claimed is:

1. A computer component system, comprising:
    a plurality of computer components;
    at least one component bay for mounting the plurality of the components in a series of separate parallel vertical planes in a side-by-side configuration;
    each one of said components having a data output ports at the front thereof and a power input connector;
    a series of individual spaced apart connector ports mounted at the front of the component bay and extending transverse to the series of separate
    parallel planes of the components;
    a series of cables for interconnecting individual ones of said series of connector ports and individual ones of the data output pods to convey electrical signals therebetween; and
    plurality of intermediate distribution units disposed at an interior of the system and extending transversely between contiguous bays and transversely to the series of parallel planes of said components in the contiguous bays and operatively interposed between the opposing bays, each said distribution unit being adopted to interface with one or more of the rear portions of the components in both of its bays for energizing electrically the components.

2. The system according to claim 1, wherein said components each include a computer blade, and
    each distribution unit adapted is to electrically communicate with vertical blades accommodated by its bay, said distribution unit being further
    adapted to provide electrical power to said blades.

3. The system according to claim 1, wherein said computer components are in the form of open structure blades which are rectangular.

4. The system according to claim 1, further including at least one fan tray which includes a plurality of horizontally distributed fans.

5. The system according to claim 1, further including distribution unit interfacing means adapted to provide electrical power to said components.

6. A system for mounting components, comprising:
a plurality of computer components adapted to be vertically mounted and each having a front and back portion;
a plurality of pairs of opposing component bays mounted in a vertically spaced apart manner, each bay being adapted to accommodate a series of the vertical components in a series of separate parallel planes in a side-by-side configuration;
each said pair of bays being disposed contiguous to one another with the back portions of the vertically mounted components being disposed contiguous to one another;
a plurality of horizontal fan units alternating with said pairs of bays, each fan unit extending between both contiguous bays of one of the pairs of bays to facilitate vertical air flow through both of said contiguous bays; and
a plurality of intermediate distribution units disposed at an interior of the system and extending transversely between contiguous bays and transversely to the series of parallel planes of said components in the contiguous bays and operatively interposed between the opposing bays, each said distribution unit being adapted to interface with one or more of the rear portions of the components in both of its bays.

7. The system according to claim 1, wherein each distribution unit is adapted to provide electrical power to said components.

8. The rack system according to claim 6, wherein said components are each open structure blades which are rectangular.

9. The system according to claim 6, wherein said components are each open structure computer blades which are rectangular.

10. A method of mounting computer components, comprising:
mounting a plurality of the components in a series of separate parallel planes in a side-by-side configuration within a component bay;
mounting a series of connecter ports at the front of the component bay extending transverse to the series of separate parallel planes of the components;
interconnecting data output pods of the components and individual ones of the connector ports by utilizing cables; and
disposing a plurality of intermediate distribution units disposed at an interior of the system and extending transversely between contiguous bays and transversely to the series of parallel planes of said components in the contiguous bays and operatively interposed between the opposing bays, each said distribution unit being adopted to interface with one or more of the rear portions of the components in both of its bays for energizing electrically the components.

* * * * *

UNITED STATES PATENT AND TRADEMARK OFFICE
CERTIFICATE OF CORRECTION

PATENT NO. : 6,867,966 B2
DATED : March 15, 2005
INVENTOR(S) : Smith et al.

It is certified that error appears in the above-identified patent and that said Letters Patent is hereby corrected as shown below:

Column 8,
Line 37, delete "each one of said components having a data output ports at"
insert -- each one of said components having a data output port at --
Line 45, delete "date output pods to convey electrical signals therebe-"
insert -- data output ports to convey elecrical signals therebe- --
Line 47, delete "plurality of intermediate distribution units disposed at an"
insert -- a purality of intermediate distribution units disposed at an --

Column 10,
Line 1, delete "The systerm according of claim 1 wherein each distri-"
insert -- The sytem according to claim 6 wherein each distri- --
Line 17, delete "interconnecting data output pods of the components and"
insert -- interconnecting data output ports of the components and --

Signed and Sealed this

Fourteenth Day of June, 2005

JON W. DUDAS
*Director of the United States Patent and Trademark Office*